(12) United States Patent
Knopf et al.

(10) Patent No.: US 7,394,713 B2
(45) Date of Patent: Jul. 1, 2008

(54) FUSE MEMORY CELL WITH IMPROVED PROTECTION AGAINST UNAUTHORIZED ACCESS

(75) Inventors: Matthias Knopf, Poing (DE); Stephan Kraus, Munich (DE); Gunther Lehmann, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 65 days.

(21) Appl. No.: 11/380,640

(22) Filed: Apr. 27, 2006

(65) Prior Publication Data

US 2006/0268616 A1 Nov. 30, 2006

(30) Foreign Application Priority Data

Apr. 27, 2005 (DE) ........................ 10 2005 019 587

(51) Int. Cl.
*G11C 7/00* (2006.01)
*G11C 5/00* (2006.01)
*G11C 11/34* (2006.01)

(52) U.S. Cl. ...................... 365/225.7; 365/52; 365/200; 365/185.09

(58) Field of Classification Search .............. 365/225.7, 365/200, 52, 185.09
See application file for complete search history.

(56) References Cited

U.S. PATENT DOCUMENTS

| | | | | |
|---|---|---|---|---|
| 4,970,686 A | * | 11/1990 | Naruke et al. | ............ 365/225.7 |
| 5,233,566 A | * | 8/1993 | Imamiya et al. | .......... 365/225.7 |
| 5,299,152 A | * | 3/1994 | Ishihara et al. | ........... 365/225.7 |
| 5,309,394 A | * | 5/1994 | Wuertz et al. | ............. 365/225.7 |
| 6,226,209 B1 | * | 5/2001 | Toda | ........................... 365/200 |
| 6,246,243 B1 | * | 6/2001 | Audy | ...................... 365/225.7 |
| 6,330,204 B1 | * | 12/2001 | Miyagi | ..................... 365/225.7 |
| 6,366,518 B1 | * | 4/2002 | Kaiser et al. | .............. 365/225.7 |
| 6,566,937 B1 | * | 5/2003 | Mori et al. | ................. 365/225.7 |
| 6,680,873 B2 | * | 1/2004 | Muraoka et al. | ......... 365/225.7 |
| 6,693,481 B1 | * | 2/2004 | Zheng | ...................... 365/225.7 |
| 6,728,158 B2 | * | 4/2004 | Takahashi et al. | ........ 365/225.7 |
| 6,781,916 B2 | * | 8/2004 | McClure | .................. 365/225.7 |
| 6,813,200 B2 | * | 11/2004 | Beer | ........................ 365/225.7 |
| 6,992,945 B2 | * | 1/2006 | Otsuka | .................... 365/225.7 |
| 7,035,158 B2 | * | 4/2006 | Kozuka | ................... 365/225.7 |
| 7,110,277 B2 | | 9/2006 | Wuidart et al. | |
| 7,136,322 B2 | * | 11/2006 | Brennan et al. | .......... 365/225.7 |
| 7,271,644 B2 | * | 9/2007 | Lin et al. | .................. 365/225.7 |
| 7,304,899 B2 | * | 12/2007 | Gerstmeier et al. | ......... 365/200 |

FOREIGN PATENT DOCUMENTS

WO 03/069630 8/2003

* cited by examiner

*Primary Examiner*—Trong Phan
(74) *Attorney, Agent, or Firm*—Patterson & Sheridan, L.L.P.

(57) ABSTRACT

A memory device is provided, the memory device having a memory cell, a programming unit for programming the memory cell, and a switching unit for optionally connecting or isolating a terminal of the memory cell to or from a potential which serves for altering an electrical property of the memory cell and for thereby effecting an altered programming state of the memory cell.

22 Claims, 1 Drawing Sheet

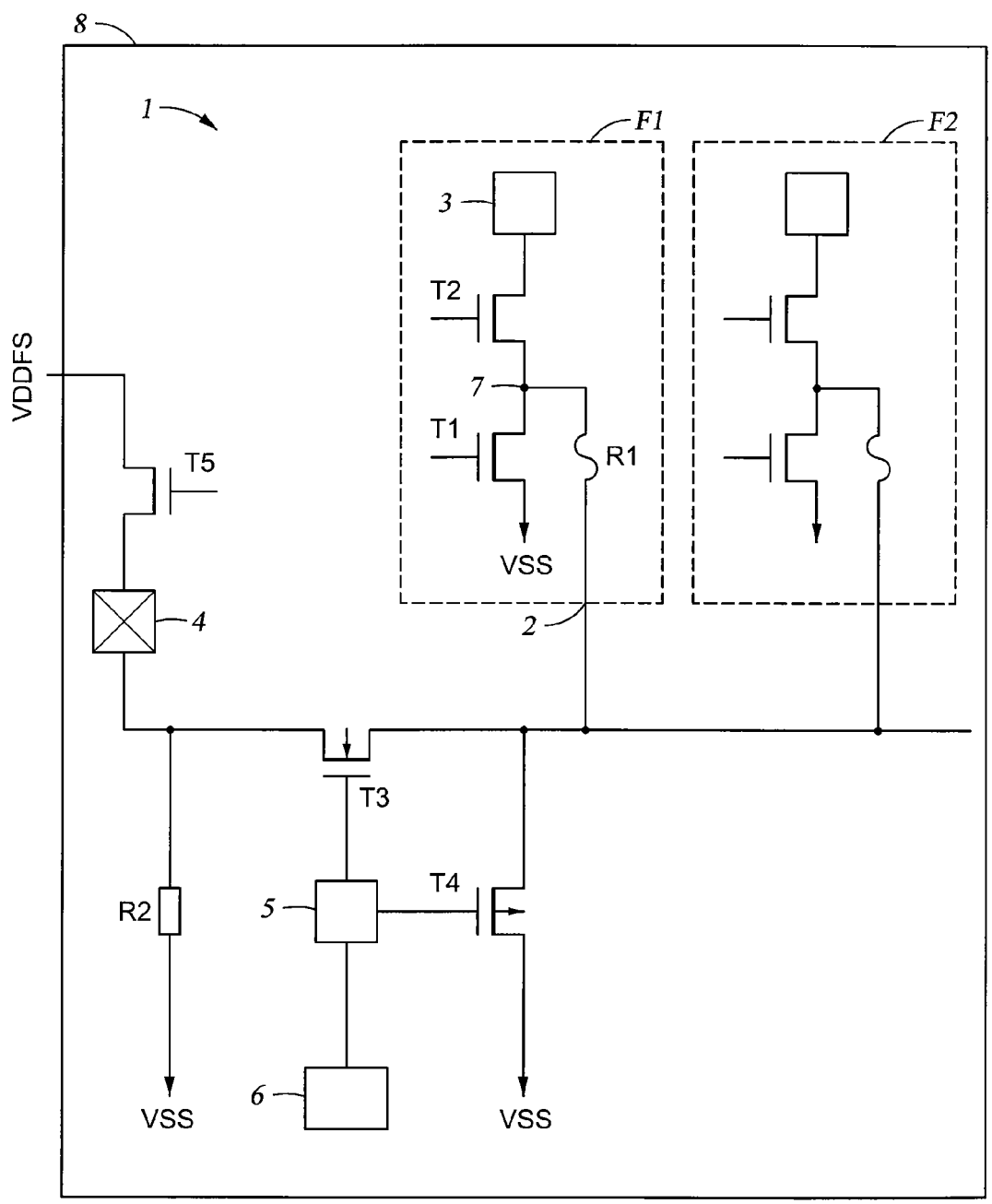
Figure

FUSE MEMORY CELL WITH IMPROVED PROTECTION AGAINST UNAUTHORIZED ACCESS

CROSS-REFERENCE TO RELATED APPLICATIONS

This application claims foreign priority benefits under 35 U.S.C. §119 to co-pending German patent application number DE 10 2005 019 587.3, filed 27 Apr. 2005. This related patent application is herein incorporated by reference in its entirety.

BACKGROUND OF THE INVENTION

1. Field of the Invention

The invention relates to a memory device whose memory information is stored in fuse memory cells. Furthermore, the invention relates to a method for operating such a memory device and a use of the memory device.

2. Description of the Related Art

So-called fuse memory cells are increasingly being used in integrated circuits, particularly in semiconductor memories, such as dynamic random access memories or DRAMs for example. A fuse memory cell essentially comprises a metal-metal connection having a low contact resistance, which can be interrupted after the actual production process, whereby the contact resistance of the fuse memory cell is increased. The fuse memory cell can thus assume the programming states "conducting" and "non-conducting", that is to say that it represents either a logic 1 or a logic 0.

The metal-metal connection of a fuse memory cell is interrupted as required either by the application of a current or by the action of a laser beam. Depending on the method by means of which their metal-metal connections can be interrupted, fuse memory cells are referred to as electrical fuse memory cells or as laser fuse memory cells.

One useful application of fuse memory cells in integrated circuits relates to the storage of secret keys for cryptography purposes and of data which are required for system configuration. Since the fuse memory cells used for this purpose are generally electrical fuse memory cells, for a corresponding programming, the respective fuse connections have to be interrupted by means of a fusing voltage that is high enough to melt the fuse resistance. For this purpose, a programming unit is provided, which is arranged on the same chip as the fuse memory cells and which has a terminal to which an external fusing voltage can be applied. After the programming has been concluded, 0 V is applied to the said terminal again.

SUMMARY OF THE INVENTION

One embodiment of the invention provides a memory device having a non-volatile memory cell in which it is not possible to detect the programming state of the memory cell in an unauthorized way. Furthermore, embodiments of the intention provide a method for operating such memory device and relate to use of the memory device as an information memory for secret data.

For example, upon every system start, the memory cells of a memory device are sequentially read once. During this time, 0 V is usually present at the terminal of the programming unit at which the fusing voltage is present during the programming operation. However, it has been found that during each operation of reading the memory information stored in one of the memory cells, a small voltage occurs at the terminal for the fusing voltage. Accordingly, the programming states of the memory cells can be deduced by measuring the voltage at the said terminal during a reading operation. The memory device according to one embodiment of the invention makes it impossible to deduce the memory information stored in the memory cell by means of a voltage measurement at the terminal for the fusing voltage.

The memory device according to one embodiment of the invention contains at least one non-volatile memory cell and a programming unit serving for programming the at least one memory cell. The programming unit has a potential terminal, to which a first fixed potential is applied at least during the programming of the memory cell. The first potential is chosen such that—if it is applied to a programming input of the at least one memory cell—it alters an electrical property of the at least one memory cell and programs the at least one memory cell in this way. If the memory cell is an electrical fuse memory cell, for example, the first potential together with a reference potential represents the fusing voltage.

The memory device according to one embodiment of the invention furthermore contains a first switching unit, which affords the user the possibility of optionally connecting the potential terminal to the programming terminal of the at least one memory cell or isolating it from the programming terminal. If the memory cell is configured as an electrical fuse memory cell, the programming terminal is the terminal to which the fusing voltage is applied during the programming of the fuse memory cell.

The memory device according to embodiments of the invention has the advantage over conventional memory devices in that the programming terminal of the memory cell can be electrically isolated from the terminal to which a programming potential is applied externally to the integrated circuit. On account of this feature, the at least one memory cell can be electrically isolated from the potential terminal during a reading operation, thereby making it impossible to deduce the memory information stored in the at least one memory cell by means of a voltage measurement at the potential terminal. This feature consequently affords improved protection against an improper read-out of the memory information stored in the memory device.

A further advantage of the memory device according to embodiments of the invention is that the first potential required for programming the at least one memory cell can be present permanently at the potential terminal of the programming unit. This facilitates the implementation of the memory device according to embodiments of the invention compared with conventional memory devices since it is now no longer necessary to apply a different potential to the potential terminal during a reading operation than during a programming operation.

In one embodiment, if the first fixed potential is not applied to the programming terminal of the at least one memory cell, a second fixed potential is applied to the programming terminal. The second fixed potential may be in particular a common ground.

In accordance with a further refinement, the memory device according to one embodiment of the invention has a reading unit serving for reading out the memory information stored in the at least one memory cell. In particular, the reading unit may be connected, by means of a second switching unit, to a reading terminal of the at least one memory cell for a reading operation. If no read-out of the memory information is provided or the at least one memory cell is intended to be programmed, the reading unit can be isolated from the reading terminal by means of the second switching unit.

For controlling the first switching unit and/or the second switching unit, the memory device according to embodiments of the invention advantageously comprises a control unit.

The control unit may be configured such that it produces the correct connections in particular for a programming operation or a reading operation. Thus, during the programming of the at least one memory cell, the first fixed potential is applied to the programming terminal of the at least one memory cell via the potential terminal of the programming unit. By contrast, during the reading out of the memory information stored in the at least one memory cell, the second fixed potential is applied to the programming terminal of the at least one memory cell.

Furthermore, during the reading out of the memory information stored in the at least one memory cell, the reading terminal of the at least one memory cell is connected to the reading unit.

It is advantageous for the first fixed potential always to be applied to the potential terminal of the programming unit. This is made possible by embodiments of the invention since the at least one memory cell can be isolated from the potential terminal by means of the first switching unit if the at least one memory cell is not intended to be programmed. What is advantageous about this feature is the reduced implementation outlay for the memory device.

As an alternative to the fixed connection of the potential terminal to the first potential, however, the memory device may include a third switching unit, by means of which it is optionally possible for a first fixed potential to be applied to the potential terminal or for said potential terminal to be isolated from said fixed potential. The third switching unit may also be controlled by the control unit.

The at least one non-volatile memory cell may be realized by at least one fuse memory cell. This may involve in particular a fuse memory cell whose fuse connection can be electrically interrupted by a correspondingly high voltage. This voltage is provided by the first fixed potential (in conjunction with a suitable reference potential), so that, during the programming of the at least one fuse memory cell, the fuse connection can be blown by the first potential present at the programming terminal.

Although electrical fuse memory cells are principally mentioned in the present patent application as an exemplary embodiment of the at least one non-volatile memory cell, it is also possible to use differently constructed memory cells. By way of example, through the programming by means of the first potential, it is also possible to alter the switching position of a switch in a memory cell and thereby to effect information storage.

The first switching unit may be constructed from transistors.

In accordance with a particularly refinement of the memory device according to one embodiment of the invention, the at least one memory cell, the first switching unit, the potential terminal of the programming unit and also the programming unit are integrated on a common substrate, that is to say that the assemblies mentioned are constituent parts of the same semiconductor chip. In particular, the remaining components of the memory device according to one embodiment of the invention may also be constituent parts of this integrated circuit. Furthermore, an integrated CMOS circuit may be involved in this case. The unit which generates the first potential is preferably not integrated on the common substrate, rather the first potential is applied externally to the potential terminal.

The method according to one embodiment of the invention serves for operating a memory device having at least one non-volatile memory cell and a potential terminal, to which a first fixed potential is applied. The method according to one embodiment of the invention comprises the following steps:
(a) programming the at least one memory cell by connecting the potential terminal to a programming terminal of the at least one memory cell, whereby an electrical property of the at least one memory cell is altered and an altered non-volatile programming state of the at least one memory cell is thus effected; and
(b) isolating the potential terminal from the programming terminal of the at least one memory cell after the programming has been concluded.

The method according to embodiments of the invention has the same advantages over conventional methods as the memory device according to embodiments of the invention.

The use according to the invention provides for the memory device according to the invention to be used for storing secret information. It has already been explained above that the memory device according to embodiments of the invention is particularly well suited to this purpose since it makes unauthorized access to the stored information significantly more difficult. Examples of secret memory information that can be considered include secret keys for cryptography purposes and data required for system configuration. In the case of a use for storing secret information, the memory device may have the features that have already been discussed previously.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The single FIGURE shows a schematic circuit diagram of a memory device 1 as an exemplary embodiment of the memory device according to the invention and of the method according to the invention.

DETAILED DESCRIPTION OF THE PREFERRED EMBODIMENT

The single FIGURE shows a schematic circuit diagram of a memory device 1 as an exemplary embodiment of the memory device according to the invention and of the method according to the invention. The memory device 1 is realized as a CMOS circuit in this exemplary embodiment.

For storing memory information, the memory device 1 has two fuse memory cells F1 and F2. Since the fuse memory cells F1 and F2 are constructed identically, only the construction of the fuse memory cell F1 is explained by way of example below. In the fuse memory cell F1, the first terminal of a fuse resistance R1 forms an input 2 of the fuse memory cell F1. The second terminal of the fuse resistance F1 is connected to a respective first terminal of the source-drain paths of two MOS transistors T1 and T2. The second terminal of the source-drain path of the MOS transistor T1 is connected to a common ground potential VSS, while in the case of the MOS transistor T2 the second terminal of its source-drain path is connected to the input of a flip-flop 3.

For programming the fuse memory cell F1, the fuse resistance R1 can be blown by applying a sufficiently high voltage. For this purpose, the MOS transistor T1 is turned on and a corresponding potential VDDFS is applied to the input 2. For reading out the programming state of the fuse memory cell F1, the MOS transistor T2 is turned on and the ground potential VSS is applied to the input 2. The precise procedure during the programming and during the read-out of the fuse memory cell F1 will be explained in more detail further below.

Only two fuse memory cells F1 and F2 are illustrated in the FIGURE. However, it is conceivable and generally also provided that the memory device 1 comprises still further fuse memory cells. The latter would then always have the same potential applied to them at their inputs 2 in the same way as the fuse memory cells F1 and F2.

The remaining components illustrated in the FIGURE serve for setting the potential required at the respective point in time at the input 2 of the fuse memory cell F1. The potential VDDFS (a first fixed potential) required for programming the fuse memory cell F1 is applied externally to a terminal 4 of the CMOS circuit. The unit that generates the potential VDDFS (a first fixed potential) is consequently not integrated into the CMOS circuit. By way of example, the potential VDDFS (a first fixed potential) may amount to about 3.5 V (±0.1 V) relative to the ground potential VSS (a second fixed potential). A MOS transistor T3 is connected by its source-drain path between the terminal 4 and the input 2 of the fuse memory cell F1. One terminal of the source-drain path of a further MOS transistor T4 is connected between the MOS transistor T3 and the input 2. The other terminal of the source-drain path of the MOS transistor T4 is at the ground potential VSS (a second fixed potential). While the MOS transistor T3 has an n-doped channel, the channel of the MOS transistor T4 is p-doped. The gate terminals of the MOS transistors T3 and T4 are driven by a drive logic 5. The drive logic 5 is formed such that it is always the case that one of the two source-drain paths of the MOS transistors T3 and T4 is in the off state and the other source-drain path is turned on. The drive logic 5 furthermore receives control signals from a control unit 6. The control unit 6 may also be situated outside the memory device 1 and may furthermore additionally perform control tasks other than those described here. In one embodiment, the memory device 1 may include a MOS transistor T5, by means of which it is optionally possible for VDDFS (a first fixed potential) to be applied to the terminal 4 of the CMOS circuit or for said terminal 4 to be isolated from VDDFS (a first fixed potential). The transistor T5 may also be controlled by the control unit 6. In another embodiment, the at least one memory cell, the MOS transistor T3, the terminal 4 of the CMOS circuit also the CMOS circuit are integrated on a common substrate 8, that is to say that the assemblies mentioned are constituent parts of the same semiconductor chip.

The memory device 1 furthermore contains a resistor R2, the resistance of which is 100 kΩ for example. The resistor R2 is connected by one of its terminals between the terminal 4 and the MOS transistor T3. The other terminal of the resistor R2 is at the ground potential VSS. The resistor R2 serves for pulling the potential at the terminal 4 to the ground potential VSS if no defined potential is present at the terminal 4.

A description is given below of the functioning of the memory device 1 during the programming of the fuse memory cell F1 and the reading out of the memory information stored in the fuse memory cell F1.

In one embodiment, there is continuously present at the terminal 4 an externally generated voltage that is large enough to blow the fuse resistance R1 of the fuse memory cells F1 and F2.

For programming, the control unit 6 drives the drive logic 5 in such a way that the latter turns the MOS transistor T3 on and turns the MOS transistor T4 off. Consequently, the potential VDDFS applied to the terminal 4 is present at the terminal 2 of the fuse memory cell F1. Furthermore, the gate terminals of the MOS transistors T1 and T2 are driven by the control unit 6 in such a way that the MOS transistor T1 becomes conducting and the MOS transistor T2 acquires high resistance. As a result, this has the effect that the voltage present at the terminal 4 is dropped across the fuse resistance R1. This generates a current flow through the fuse resistance R1 which blows the metal-metal connection.

For establishing the programming state of the fuse memory cell F1, the gate terminals are acted on such that the source-drain paths of the MOS transistors T2 and T4 are conducting and the source-drain paths of the MOS transistors T1 and T3 acquire high resistance. This has the effect that the input 2 is at the ground potential VSS and is additionally electrically decoupled from the terminal 4 by the MOS transistor T3. Furthermore, the fuse resistance R1 is connected to the flip-flop 3 (reading unit) via a node 7 as a result of the gate terminal of the MOS transistor T2 being acted on in the manner described, so that it can be established by means of the flip-flop 3 (reading unit) whether the fuse resistance R1 is intact or has been blown. The programming state of the fuse memory cell F1 can be determined on the basis of this measurement.

The arrangement of the memory device 1 has the advantage that the terminal 4 is electrically decoupled from the fuse memory cells F1 and F2 during the read-out of the programming state of the fuse memory cells F1 and F2. This makes it impossible to deduce the programming state of the fuse memory cells F1 and F2 during the read-out by means of a voltage measurement at the terminal 4. Therefore, the memory device 1 can be used particularly advantageously to store secret information in the fuse memory cells F1 and F2.

Furthermore, the construction of the memory device 1 enables a simpler implementation since it is not necessary to apply the ground potential VSS to the terminal 4 during the reading out operation. Rather, the voltage VDDFS required for blowing the fuse connection R1 may be present at the terminal 4 in a constant manner.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   at least one non-volatile memory cell having a programming terminal;
   a programming unit for programming the at least one memory cell, the programming unit having a potential terminal to which a first fixed potential is applied;
   a first switching unit configured to selectively connect the potential terminal to the programming terminal of the at least one memory cell and isolate the potential terminal from the programming terminal of the at least one memory cell, wherein the first fixed potential, when applied for a first time to the programming terminal of the at least one non-volatile memory cell, alters an electrical property of the at least one memory cell, thereby effecting an altered non-volatile programming state of the at least one non-volatile memory cell, wherein the memory device is integrated in a semiconductor chip, and wherein the non-volatile memory cell is electrically decoupled from the potential terminal which is accessible externally from the semiconductor chip during read-out of the programming state of the at least one non-volatile memory cell.

2. The memory device of claim 1, wherein the first switching unit is configured to apply a second fixed potential to the programming terminal of the at least one memory cell when the potential terminal of the programming unit is isolated from the programming terminal of the at least one memory cell.

3. The memory device of claim 2, further comprising:
a reading unit for reading out information stored in the at least one memory cell; and
a second switching unit configured to selectively connect the reading unit to a reading terminal of the at least one memory cell.

4. The memory device of claim 3, further comprising:
a control unit for controlling at least one of the first switching unit and the second switching unit.

5. The memory device of claim 4, wherein the control unit controls the first switching unit to apply the first fixed potential to the programming terminal of the at least one memory cell during a programming of the at least one memory cell, and to apply the second fixed potential to the programming terminal of the at least one memory cell during the reading out of an information stored in the at least one memory cell.

6. The memory device of claim 5, wherein the control unit controls the second switching unit to connect the reading unit to the reading terminal of the at least one memory cell during a reading out of the information stored in the at least one memory cell.

7. The memory device of claim 1, wherein the potential terminal of the programming unit is fixedly connected to the first fixed potential.

8. The memory device of claim 3, further comprising:
a third switching unit for selectively connecting the potential terminal of the programming unit to the first fixed potential and isolating the potential terminal of the programming unit from the first fixed potential.

9. The memory device of claim 1, wherein the at least one non-volatile memory cell is realized by at least one fuse memory cell.

10. The memory device of claim 9, wherein a fuse connection of the at least one fuse memory cell is electrically interrupted when the first fixed potential is applied to the programming terminal of the at least one fuse memory cell.

11. The memory device of claim 10, wherein, during the programming of the at least one fuse memory cell, a fuse connection is blown by the first potential present at the programming terminal.

12. The memory device of claim 1, wherein the first switching unit comprises MOS transistors.

13. The memory device of claim 1, further comprising:
a common substrate on which the at least one memory cell, the first switching unit, the potential terminal and further components of the memory device are integrated, and
wherein the first potential is applied to the potential terminal from externally.

14. A method for operating a memory device having at least one non-volatile memory cell and a potential terminal to which a first fixed potential is applied, the method comprising:
programming the at least one memory cell by connecting the potential terminal to a programming terminal of the at least one memory cell, whereby an electrical property of the at least one memory cell is altered and an altered non-volatile programming state of the at least one memory cell is effected; and
isolating the potential terminal from the programming terminal of the at least one memory cell after at least one memory cell has been programmed, wherein the memory device is integrated in a semiconductor chip, and wherein the non-volatile memory cell is electrically decoupled from the potential terminal which is accessible externally from the semiconductor chip during read-out of the programming state of the at least one non-volatile memory cell.

15. The method of claim 14, further comprising:
applying a second fixed potential to the programming terminal of at least one memory cell to isolate the potential terminal from the programming terminal.

16. The method of claim 15, wherein, during a reading out of an information stored in the at least one memory cell, the second fixed potential is applied to the programming terminal of the at least one memory cell.

17. The method of claim 14, wherein the potential terminal is fixedly connected to the first fixed potential.

18. The method of claim 14, wherein the at least one non-volatile memory cell comprises at least one fuse memory cell.

19. The method of claim 18, wherein a fuse connection of the at least one fuse memory cell is electrically interrupted by the programming.

20. The method of claim 19, wherein, during the programming of the at least one fuse memory cell, the fuse connection is blown by the first potential present at the programming terminal.

21. The method of claim 14, wherein the memory device has a common substrate on which the at least one memory cell, the potential terminal and further components of the memory device are integrated, and wherein the first potential is applied to the potential terminal externally.

22. The method of claim 14, wherein the at least one memory cell is programmed to store secret information.

\* \* \* \* \*